United States Patent
Chou et al.

(10) Patent No.: US 6,261,852 B1
(45) Date of Patent: Jul. 17, 2001

(54) CHECK ABNORMAL CONTACT AND VIA HOLES BY ELECTROPLATING METHOD

(75) Inventors: Ming-Chun Chou, Taipei; Huai-Jen Shu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/294,052

(22) Filed: Apr. 19, 1999

(51) Int. Cl.[7] ................................................. G01R 31/26
(52) U.S. Cl. ............................. 438/14; 438/617; 438/638; 257/253; 257/252; 257/30; 427/540; 427/571
(58) Field of Search .............................. 438/14, 15, 617, 438/638; 257/253, 252, 30; 427/540, 571; 428/336

(56) References Cited

U.S. PATENT DOCUMENTS

| | | |
|---|---|---|
| 3,719,884 | 3/1973 | Laroche ................................. 324/54 |
| 4,019,129 | 4/1977 | Grau ..................................... 324/30 R |
| 4,431,967 | 2/1984 | Nishioka ........................... 324/158 R |
| 4,980,019 | 12/1990 | Baerg et al. ......................... 156/643 |
| 5,323,350 | * 6/1994 | McLaury ............................... 365/208 |
| 5,504,389 | * 4/1996 | Dickey ................................... 313/506 |
| 5,532,614 | * 7/1996 | Chiu ....................................... 324/763 |
| 5,619,482 | * 4/1997 | Tezuka ................................ 369/44.23 |
| 5,657,266 | * 8/1997 | McLaury ............................... 365/149 |
| 5,708,371 | 1/1998 | Koyama ................................ 324/752 |
| 5,859,442 | * 1/1999 | Manning ................................. 257/48 |
| 6,107,111 | * 8/2000 | Manning ................................. 438/18 |
| 6,133,053 | * 10/2000 | Wright ................................... 438/14 |
| 6,137,338 | * 10/2000 | Marum ................................. 327/318 |

* cited by examiner

*Primary Examiner*—John F. Niebling
*Assistant Examiner*—Andie C Stevenson
(74) *Attorney, Agent, or Firm*—George O. Saile; Stephen B. Ackerman

(57) ABSTRACT

A cathode-anode apparatus is constructed whereby the wafer under test, connected to a conducting wire, forms the cathode terminal and a copper plate, also connected to a conducting wire, forms the anode terminal. The wafer under test and the copper plate are immersed in a $CuSO_4$—$H_2O$ solution. A positive dc voltage is applied to the copper plate; the dc current ionizes the $CuSO_4$ solution and forms $Cu^{2+}$ ions. These $Cu^{2+}$ ions will diffuse to the wafer surface. Most of the $Cu^{2+}$ ions will accumulate in and around defective contacts or vias in the semiconductor surface making these defective contacts or vias readily identifiable.

6 Claims, 2 Drawing Sheets

CHECK ABNORMAL CONTACT AND VIA HOLES BY ELECTROPLATING METHOD

BACKGROUND OF THE INVENTION (1) Field of the Invention

The invention relates to the fabrication of integrated circuit devices, and more particularly, to a method of marking defective contacts by electroplating and by observing the electroplated contacts.

(2) Description of the Prior Art

For the mass production of semiconductor devices silicon, in single or in polycrystalline form, is most widely used. Repetitive patterns of identical circuits or circuit elements are patterned on a single silicon wafer. A large variety of materials is thereby used to create the semiconductor devices, these material can be electrically conductive, electrically non-conductive (isolating) or electrically semi-conductive. A common technique to control the conductivity of various regions in a semiconductor device is the addition of impurities or dopants. Dopants can be of one of two types: dopants which have one less valence electron than the doped material, normally silicon, and therefore introduce P-type impurities, and dopants that have one more valence electron than the doped material and therefore introduce N-type impurities in the doped material. An example of P-type dopant is boron; an example of N-type dopant is phosphorous. Silicon doped with boron therefore becomes P-type silicon while silicon doped with phosphorous becomes N-type silicon.

Areas to which electrical contacts must be made are normally referred to as active areas. Examples of active areas to which electrical contacts must be established are the source and drain regions of DRAM devices; these source and drain regions are created as specially doped regions in the surface of the semiconductor substrate. Methods of establishing electrical contact between layers of conductive metal or interconnecting wiring use via holes between the various layers to create electrical contact from one level to adjacent levels. Continued miniaturization of semiconductor devices has led to continued emphasis on reliability and yield aspects that are encountered in the creation of via holes. Via holes may be created in layers of dielectric or insulator and may have a diameter smaller than 0.5 um. Filling of these vias presents special problems of even and uniform flow rate of the metal that is used to fill the vias in addition to problems of surface planarity and the appearance of surface irregularities in the surface of the vias after planarization. Other problems relate to adherence of the deposited metal to the created via opening, uniformity of profile of the created via, aspect ratio of the created hole and problems created by holes with high aspect ratios. It is, for instance, difficult to deposit aluminum using Chemical Vapor Deposition techniques and to obtain a deposition in the filled opening that is uniform. The sputtering of aluminum frequently leads to uneven deposition inside the via hole where this hole has micron or sub-micron dimensions. Uneven distribution of the sputtered aluminum results in uneven current densities that can cause electromigration and problems of via reliability. The recent trend has therefore been to use tungsten filler for contact openings where this tungsten is deposited using Low Pressure CVD (LPCVD) techniques. Tungsten is characterized by a more even distribution of the tungsten inside the hole after depositing and is therefore less prone to electromigration and problems of via reliability.

For the creation of contact vias, the Damascene process is used for a number of applications. The most commonly applied process is first metal or local interconnects. Some early Damascene structures have been achieved using Reactive Ion Etching (RIE) but Chemical Mechanical Planarization (CMP) is used exclusively today. Metal interconnects using Damascene of copper and of aluminum are also being explored. The Damascene process first forms a metal plug in the surface of the substrate after which an intra-level dielectric (ILD, for instance $SiO_2$) is deposited using for instance Plasma Enhanced CVD (PECVD) technology. Trenches are created in the ILD for metal lines using Reactive Ion Etching (RIE) technology, a layer of metal is deposited over the trenches (using either CVD or a metal flow process) and planarized down to the top surface of the ILD using the CMP process. The metal plug is aligned with some of the metal lines and forms a first level interconnect.

The application of the Damascene process continues to gain wider acceptance, most notably in the process of copper metalization due to the difficulty of copper dry etch where the Damascene plug penetrates deep in very small, sub-half micron, Ultra Large Scale integrated devices. Recent applications have successfully used copper as a conducting metal line, most notably in the construct of CMOS 6-layer copper metal devices. Even for these applications however, the wolfram plug is still used for contact points in order to avoid damage to the devices.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Yet another approach to forming the dual damascene structure is to form an insulating layer that is coated with a photoresist. The photoresist is exposed through a first mask with image pattern of the via openings, this via pattern is anisotropically etched in the upper half of the insulating layer. The photoresist now is exposed through a second mask with an image pattern of the conductive line. The pattern of the conducting lines is aligned with the pattern of the vias thereby encompassing the via openings. In anisotropically etching the openings for the conductive lines in the upper half of the insulating material, the via openings already present in the upper half are simultaneously etched and replicated in the lower half of the insulating material.

Dual damascene is an improvement over single damascene because it permits the filling of both the conductive grooves and vias with metal at the same time, thereby eliminating process steps.

For all of the above-indicated examples it is required that a dependable method is available to perform contact hole analysis. This analysis can be a direct analysis of contact holes or it can be an analysis of contact holes that is initiated by chip testing results that raise questions of contact hole performance. In these cases it is important that abnormal contact holes can be readily and dependably located for further analysis.

U.S. Pat. No. 3,719,884 (Laroche) shows a method and apparatus to find pinholes by electroplating a component (varnish) and measuring the current consumed. The prior art section describes electroplating defect/pinholes with Cu to visually mark the defect. This is extremely close to the invention.

U.S. Pat. No. 5,708,371 (Koyama) shows a method for using a photo-induced current in a conductive line having a defect or high resistance area. However, this reference differs from the invention.

U.S. Pat. No. 4,431,967 (Nishioka) shows a method for observing electrical defects with a LCD film/plate.

U.S. Pat. No. 4,980,019 (Baerg et al.) teaches an etch back process for semiconductor failure analysis.

U.S. Pat. No. 4,019,129 (Gra) shows a method for measuring defects in insulating films by plating and measuring the electric current of the plating.

SUMMARY OF THE INVENTION

A principle objective of the invention is to locate defective contacts or vias during semiconductor processing.

It is another objective of the invention to facilitate chip analysis by rapidly locating defective contacts or vias in a semiconductor device.

It is another objective of the invention to evaluate the degree of resistivity of contacts or vias in a semiconductor device.

It is another objective of the invention to form a cap over defective contacts or vias in a semiconductor surface whereby this cap serves as a protecting layer over the contact or via area after defect analysis has been completed.

It is another objective of the invention to locate and analyze defective contacts or vias in a semiconductor surface by using an Optical Microscope.

It is another objective of the invention to provide a clear view of defective contacts or vias after Focused Ion Beam (FIB) milling of the identified defective contacts or vias.

In accordance with the objectives of the invention a new method is provided to locate defective contacts or vias in a semiconductor surface of a wafer. A battery like arrangement of cathode-anode is constructed whereby the wafer under test, connected to a conducting wire, forms the cathode terminal and a copper plate, also connected to a conducting wire, forms the anode terminal. The surface area of the wafer under test wherein defective contacts or vias need to be identified and the copper plate are immersed in a $CuSO_4$—$H_2O$ solution. A positive dc voltage is applied to the copper plate (the anode), dc current flows from the anode (the copper plate) to the cathode (the wafer under test). The dc current ionizes the $CuSO_4$ solution and forms $Cu^{2+}$ ions. These $Cu^{2+}$ ions will, due to the dc voltage difference between the anode and the cathode plate, diffuse to the immersed surface of the wafer under test and will accumulate on this surface where such accumulation is most likely. Concentrations of $Cu^{2+}$ ions will accumulate around areas of low resistance on the semiconductor surface, since low resistance results in high current density. Areas of low resistance are areas of defective contacts and vias in the surface of a wafer. Normal (not defective) contacts and vias provide a good surface for nucleation during electroplating. Areas of low resistance (defective contacts or vias) will, by contrast, result in the deposition of $Cu^{2+}$ ions around these defective contacts and vias. The concentrations of $Cu^{2+}$ ions will remain in place after the wafer under test is removed from the immersion bath, analyses of the defective contacts and vias in the semiconductor surface can now proceed quickly and effectively since the accumulated copper on the surface under test provides a clear indication as to the presence of defective contacts and vias in the semiconductor surface.

These defective contacts and vias may be missing via plugs, poor metal deposition in the contact opening, poor planarization of the contacts, potential for electromigration in the contact plug, poor contact profile, contact under-etch or over-etch.

DESCRIPTION OF THE PREFERRED EMBODIMENTS

Figure 1:
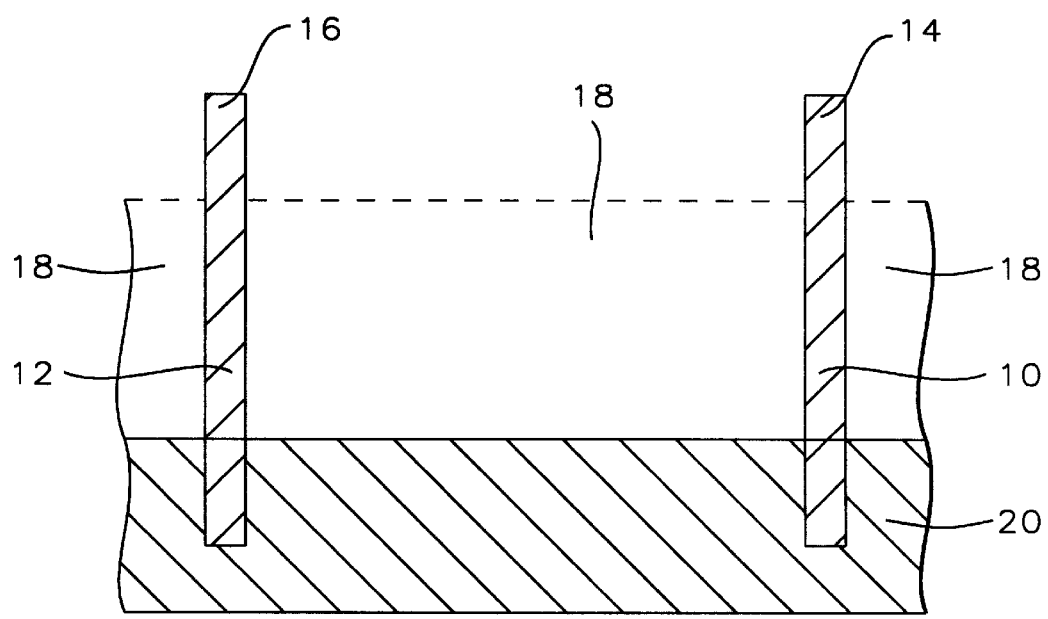
FIG. 1 shows a cross section of the test arrangement for the wafer under test.

Referring now specifically to FIG. 1, there is shown a cross section of a vat or container 18 wherein a solution 20 of $CuSO_4$—$H_2O$ has been provided. Copper plate 12 is partially immersed in the $CuSO_4$—$H_2O$ solution 20, the surface area of the wafer 10 that is analyzed is also immersed in the $CuSO_4$—$H_2O$ solution. The wafer 10 that is analyzed can be partially or completely immersed into the $CuSO_4$—$H_2O$ solution 20, in most practical applications partial immersion will suffice since this partial immersion allows for locating suspected or questionable contacts or vias of the wafer under test. Copper plate 12 is connected to a conducting line 16 while the wafer under test 10 is connected to a conducting line 14. A positive dc voltage is applied to conducting line 16; a negative or ground voltage is applied to the conducting line 14. This application of the dc voltage makes the copper plate 12 from an electrical point of view the anode terminal while the wafer under test 10 functions as the cathode terminal. A dc current will therefore flow from the positive (anode) terminal 12 to the negative (cathode) terminal 10. This dc current will ionize the copper in the $CuSO_4$—$H_2O$ solution and in so doing will create $Cu^{2+}$ ions. These $Cu^{2+}$ ions will, due to the voltage differential between the anode and the cathode, diffuse to the cathode and will, when reaching the cathode (that is the surface of the wafer under test 10), accumulate on this surface where this accumulation is most likely to occur. Defective contacts and vias in the surface of a wafer form areas of low resistance in the surface of the wafer. Low resistance results in high current density, concentrations of $Cu^{2+}$ ions will therefore accumulate around areas of low resistance on the semiconductor surface. Normal (not defective) contacts and vias provide a good surface for nucleation during electroplating. Areas of low resistance (defective contacts or vias) will, by contrast, result in the deposition of $Cu^{2+}$ ions around these defective contacts and vias. The concentrations of $Cu^{2+}$ ions will remain in place after the wafer under test is removed from the immersion bath, analyses of the defective contacts and vias in the semiconductor surface can now proceed quickly and effectively since the accumulated copper on the surface under test provides a clear indication as to the presence of defective contacts and vias in the semiconductor surface.

The points where the $Cu^{2+}$ ions accumulate are the areas of defective contacts or vias in the semiconductor surface under test. The $Cu^{2+}$ ions will, after sufficient accumulation has occurred inside defective contacts or vias, further accumulate on the surface of the area around the defective contacts or vias and will, in so doing, identify these areas for further analysis.

The level of the dc voltage that is applied between the anode and the cathode is application dependent; a range of values that is expected to be suitable is from 10 to 25 volt dc. The basic principle of the invention rests on the movement of suspended particles, the $Cu^{2+}$ ions, through a fluid under the action of an electromotive force applied to electrons in contact with the suspension (electrophoresis). The amount of material deposited at the electrodes during electrophoresis is directly proportional to the current that is passed between the electrodes. The current conducted through the $CuSO_4$—$H_2O$ solution is proportional to the surface area of the defective contacts and vias, the larger the area of the defective contacts and vias (resulting in lower resistance) the larger the current needs to be in order to highlight the defective contacts and vias. Other factors need to be considered in determining the dc voltage applied to the electrodes such as the renewal rate and condition of the $CuSO_4$—$H_2O$ solution since this determines the $Cu^{2+}$ ion concentration and therefore the accumulation of $Cu^{2+}$ ions in the areas of defective contacts and vias. The current passed through the solution also depends on the time duration of the application of this current since, while the current is being applied, electrical conditions of conductivity change due to the build up of $Cu^{2+}$ ions on the semiconductor surface and due to $Cu^{2+}$ ions depletion in the $CuSO_4$—$H_2O$ solution. Since the principle objective of the invention is to detect and identify defective contacts and vias, it may not be of critical importance to specify exactly the quantity of the $Cu^{2+}$ ions that accumulate around the areas of defects. Where it is of importance to differentiate between defective contacts and vias and to identify the type or size of the defective contact or via, a clear correlation must be established between the accumulated quantity of the $Cu^{2+}$ ions and the above highlighted operational parameters that effect this accumulation. It may in this respect be of importance to specify the application of the dc voltage between the electrodes for a time duration that extends to the point where the current flowing between the electrodes has decreased to a very low value. This in order to assure that the conditions of deposition of $Cu^{2+}$ ions are well defined and that, as a consequence, concrete conclusions can be drawn as to the nature and extent of the defects. The operational conditions under which the invention is implemented may therefore differ from application to application and must, for each application, be experimentally determined under strict and precise control and definition of the processing parameters such as dc voltage applied between the electrodes, $CuSO_4$—$H_2O$ solution concentrations, distance between the electrodes, $CuSO_4$—$H_2O$ solution renewal frequency and ambient temperature.

Although the time during which the wafer under test is immersed in the $CuSO_4$—$H_2O$ solution is also application dependent, it is expected that, for most applications, a time of no more than 30 seconds is adequate to identify defective contacts or vias in the semiconductor surface.

Figure 2:
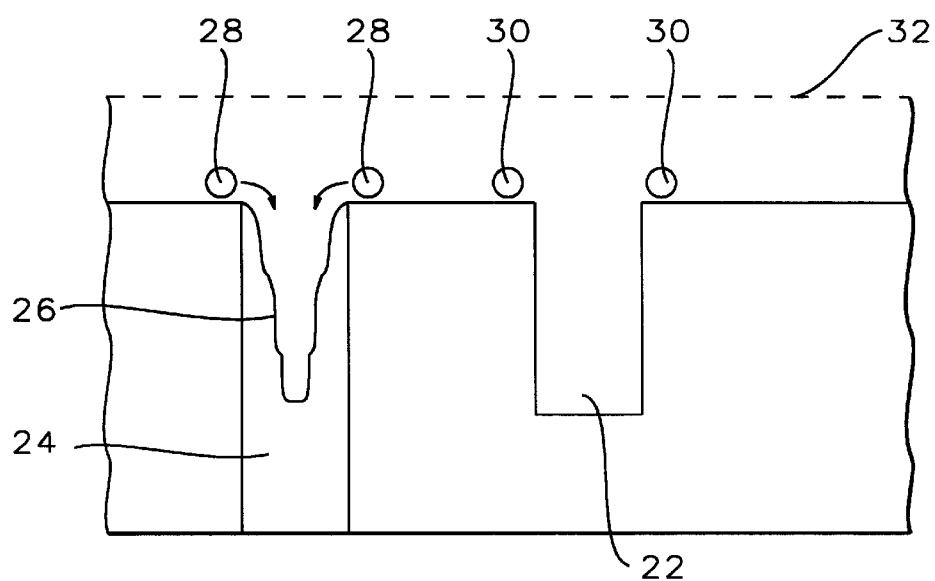
FIG. 2 shows a cross section of defective contact and the $Cu^{2+}$ accumulated around the contact openings.

FIG. 2 shows a cross section of two defective vias, 22 and 24. The via 22 shown is an open contact, the via 24 shows defective copper plating 26 contained within the via 24. $Cu^{2+}$ ions 30 accumulate around the top surface of the open contact 22 while $Cu^{2+}$ ions 28 will enter via 24 and accumulate on the surface of the defective copper plating 26. Normal level of nucleation during the process of electroplating is indicated as level 32. If the process of $Cu^{2+}$ ions is extended to the point where the $Cu^{2+}$ ions have completely filled the opening created in via 24 by the defective copper plating, the $Cu^{2+}$ ions will further accumulate around the opening and on the surface of via 24, thus identifying this via as being defective.

Figure 3:
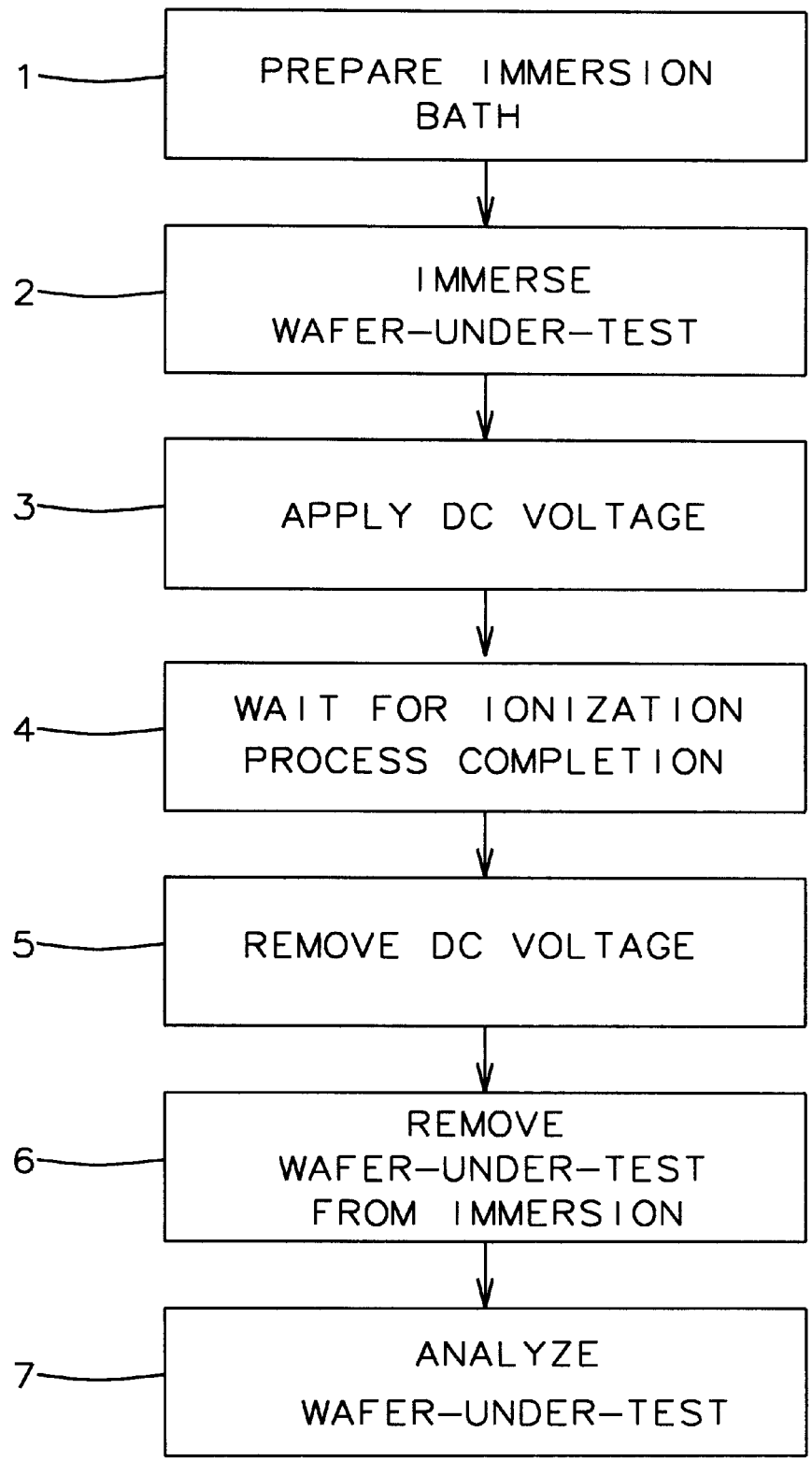
FIG. 3 shows the operational sequence for the analysis of a wafer under test using the invention.

FIG. 3 shows a flow chart of the operational sequence for the implementation of the invention. Step 1 indicates the preparation of the container for the immersion of the copper plate and the wafer under test. The container is filled with the $CuSO_4$—$H_2O$ solution, electrical wires are attached to the copper plate and the wafer under test.

FIG. 3, step 2 indicates the positioning of the copper plate and the wafer under test into the container. Proper directional positions are assured for the copper plate and the wafer under test where both face each other with the surface of the wafer under test facing the copper plate. The planes of the copper plate and the wafer under test are parallel, the copper plate and the wafer under test are mounted at a suitable distance from each other and from the sidewalls of the container.

FIG. 3, step 3 shows the connecting of the wires (that are connected to the copper plate and the wafer under test) to a dc voltage battery. The copper plate now functions as the anode while the wafer under test functions as the cathode of a two electrode apparatus.

FIG. 3, step 4 indicates that the process of electroplating is allowed to continue for a suitable length of time. This length of time is, as previously indicated, application dependent and is further determined by the type of analysis that is required to be performed, that is merely locating defective contacts and vias or, in addition to locating these defects, also being able to differentiate between the type and degree of defect.

FIG. 3, step 5 indicates the termination of the application of the dc voltage between the copper plate and the wafer under test. The process of electroplating is assumed to have proceeded for a length of time whereby the objectives of the invention have been met, that is locate defective contacts and vias and, if required, be able to differentiate between type of defect.

FIG. 3, step 6 indicates the removal of the wafer under test from the container for further analysis.

FIG. 3, step 7 indicates the step of defect analysis on the surface of the wafer. This defect analysis can be performed using a standard optical microscope.

Defect analysis can be performed by Focused Ion Beam (FIB) milling whereby a cross section is obtained of the area that is to be analyzed. This process can be further improved by the addition of a layer of metal, a metal cap, to the surface area that needs to be analyzed prior to the milling operation. The metal ions (of the metal cap) will fill voids and will therefore make the voids in defective contacts or vias more visible.

What has been described is considered to be only one illustrative testing apparatus that is in accordance with the principles of the invention. It is however understood that various and numerous other arrangements may be devised in accordance with and by one skilled in the art whereby these other arrangements remain within the spirit and scope of the invention as defined by the accompanying claims.

What is claimed is:

1. A method for locating defective contacts or vias on a semiconductor surface, comprising the steps of:

Providing a wafer to be tested for said defective contacts and vias said wafer containing a semiconductor surface;

Providing a copper plate;

Positioning said wafer to be tested within said container;

Positioning said copper plate within said container; and

Applying a voltage between said wafer to be tested and said copper plate.

2. The method of claim 1 wherein said container has a cross section in the horizontal plane that essentially resembles the shape of a geometric rectangle said container further has a height essentially equal to the diameter of the largest wafer to be tested whereby further the sides of said container have a first and a second small surface area and a first and a second large surface area whereby the planes of the first and second small areas are parallel whereby further the planes of the first and second large areas are parallel.

3. The method of claim 1 wherein said copper-silicon-oxide solution is $CuSO_4$ mixed with $H_2O$.

4. The method of claim 1 wherein said providing a wafer to be tested is:

mounting said wafer inside said container with the plane of said wafer being parallel to the plane of said first small surface area of said container thereby forming the cathode of a two electrode apparatus said wafer being attached to a conducting wire;

mounting said wafer such that the semiconductor surface that is to be tested is submerged within said copper-silicon-oxide solution;

mounting said wafer in relatively close proximity to said first small surface area of said container; and facing said semiconductor surface that is to be tested toward said second small surface area of said container.

5. The method of claim 1 wherein said providing said copper plate within said container is:

mounting said copper plate inside said container with the plane of said copper plate being parallel to the plane of said second small surface area of said container thereby forming the anode of a two electrode apparatus said copper plate being attached to a conducting wire;

mounting said copper such that said copper plate is at least partially submerged within said copper-silicon-oxide solution; and mounting said copper plate in relatively close proximity to said second small surface area of said container.

6. The method of claim 2 whereby applying a voltage between said wafer to be tested and said copper plate is applying direct current e.m.f. between said wafer and said copper plate for a selected period of time thereby causing the creation of $Cu^{2+}$ ions within said copper-silicon-oxide solution whereby said $Cu^{2+}$ ions are forced to diffuse to the surface of said wafer thereby causing accumulation of said $Cu^{2+}$ ions on defective contacts or vias of said wafer surface.

* * * * *